(12) United States Patent
Olson

(10) Patent No.: US 9,088,124 B2
(45) Date of Patent: Jul. 21, 2015

(54) SEMICONDUCTOR LASER WITH CATHODE METAL LAYER DISPOSED IN TRENCH REGION

(71) Applicant: Seagate Technology LLC, Cupertino, CA (US)

(72) Inventor: Scott Eugene Olson, Eagan, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/585,591

(22) Filed: Dec. 30, 2014

(65) Prior Publication Data

US 2015/0110145 A1   Apr. 23, 2015

Related U.S. Application Data

(60) Division of application No. 13/802,239, filed on Mar. 13, 2013, now Pat. No. 8,923,357, which is a continuation-in-part of application No. 13/231,529, filed on Sep. 13, 2011, now Pat. No. 8,532,156.

(51) Int. Cl.
*H01S 5/022* (2006.01)
*H01S 5/042* (2006.01)
*H01S 5/20* (2006.01)
*H01S 5/34* (2006.01)
(Continued)

(52) U.S. Cl.
CPC ........... *H01S 5/0425* (2013.01); *H01S 5/02248* (2013.01); *H01S 5/02272* (2013.01); *H01S 5/042* (2013.01); *H01S 5/20* (2013.01); *H01S 5/2202* (2013.01); *H01S 5/34* (2013.01); *H01L 33/382* (2013.01); *H01L 33/385* (2013.01); *H01L 33/387* (2013.01)

(58) Field of Classification Search
CPC ..... H01S 5/042; H01S 5/0425; H01S 5/2202; H01L 21/0425; H01L 21/048; H01L 21/28; H01L 21/283; H01L 21/77; H01L 33/382; H01L 33/385; H01L 33/387; G02B 6/4201; G02B 6/4274

See application file for complete search history.

(56) References Cited

U.S. PATENT DOCUMENTS 6,822,329 B2   11/2004   Varrot et al.
7,157,734 B2   1/2007   Tsao et al.
(Continued)

FOREIGN PATENT DOCUMENTS

JP   11274634   10/1999

OTHER PUBLICATIONS

International Search Report and Written Opinion from PCT Application No. PCT/US2014/024206 dated Jul. 30, 2014, 12 pages.

(Continued)

*Primary Examiner* — Armando Rodriguez
(74) *Attorney, Agent, or Firm* — Hollingsworth Davis, LLC

(57) ABSTRACT

A laser diode includes a substrate and a junction layer disposed on the substrate. The junction layer forms a quantum well of the laser diode. The laser diode includes a junction surface having at least one channel that extends through the junction layer to the substrate. The at least one channel defines an anode region and a cathode region. A cathode electrical junction is disposed on the junction surface at the cathode region, and an anode electrical junction is disposed on the junction surface and coupled to the junction layer at the anode region. A cathode metal layer is disposed in at least a trench region of the channel. The cathode metal layer couples the substrate to the cathode electrical junction.

14 Claims, 9 Drawing Sheets

(51) Int. Cl.
  *H01S 5/22*    (2006.01)
  *H01L 33/38*   (2010.01)

(56) References Cited

U.S. PATENT DOCUMENTS

| | | |
|---|---|---|
| 7,196,428 B2 | 3/2007 | Chen |
| 7,323,784 B2 | 1/2008 | Yiu et al. |
| 7,372,153 B2 | 5/2008 | Kuo et al. |
| 7,391,114 B2 | 6/2008 | Mimura et al. |
| 7,501,704 B2 | 3/2009 | Marsanne et al. |
| 7,592,710 B2 | 9/2009 | Hsia et al. |
| 7,629,689 B2 | 12/2009 | Maeda |
| 8,532,156 B2 | 9/2013 | Olson |
| 8,923,357 B2 | 12/2014 | Olson |
| 2002/0139567 A1 | 10/2002 | Kim et al. |
| 2003/0231682 A1 | 12/2003 | Eitel |
| 2004/0206975 A1 | 10/2004 | Tojo et al. |
| 2010/0117080 A1 | 5/2010 | Chen et al. |
| 2011/0266469 A1 | 11/2011 | Goulakov et al. |
| 2012/0008470 A1 | 1/2012 | Shimazawa et al. |

OTHER PUBLICATIONS

File History from U.S. Appl. No. 13/802,239.
File History from U.S. Appl. No. 13/231,529.

SEMICONDUCTOR LASER WITH CATHODE METAL LAYER DISPOSED IN TRENCH REGION

CROSS REFERENCE TO RELATED CASES

This is a divisional of U.S. patent application Ser. No. 13/802,239, filed Mar. 13, 2013, which is a continuation-in-part of U.S. patent application Ser. No. 13/231,529, filed Sep. 13, 2011, now U.S. Pat. No. 8,532,156, which are hereby incorporated by reference in their entireties.

SUMMARY

Various embodiments described herein are generally directed to semiconductor lasers used in applications such as heat assisted magnetic recording. In one embodiment, a laser diode includes a substrate and a junction layer disposed on the substrate. The junction layer forms a quantum well of the laser diode. The laser diode includes a junction surface having at least one channel that extends through the junction layer to the substrate. The at least one channel defines an anode region and a cathode region. A cathode electrical junction is disposed on the junction surface at the cathode region, and an anode electrical junction is disposed on the junction surface and coupled to the junction layer at the anode region. A cathode metal layer is disposed in at least a trench region of the channel. The cathode metal layer couples the substrate to the cathode electrical junction.

In another embodiment, a laser diode includes a junction surface having two elongated channels extending along a laser output direction of the laser diode. The junction surface includes an anode electrical junction disposed in an anode region between the two elongated channels, and two or more cathode electrical junctions disposed in one or more cathode regions outside of the anode region. The laser diode includes a junction layer disposed beneath the junction surface. The junction layer forms a quantum well at the anode region. The laser diode includes a substrate beneath the junction layer. The elongated channels extend through the junction layer to the substrate at a trench region. A cathode metal layer extends into the trench region. The cathode metal layer couples the substrate to the two or more cathode electrical junction.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1A:
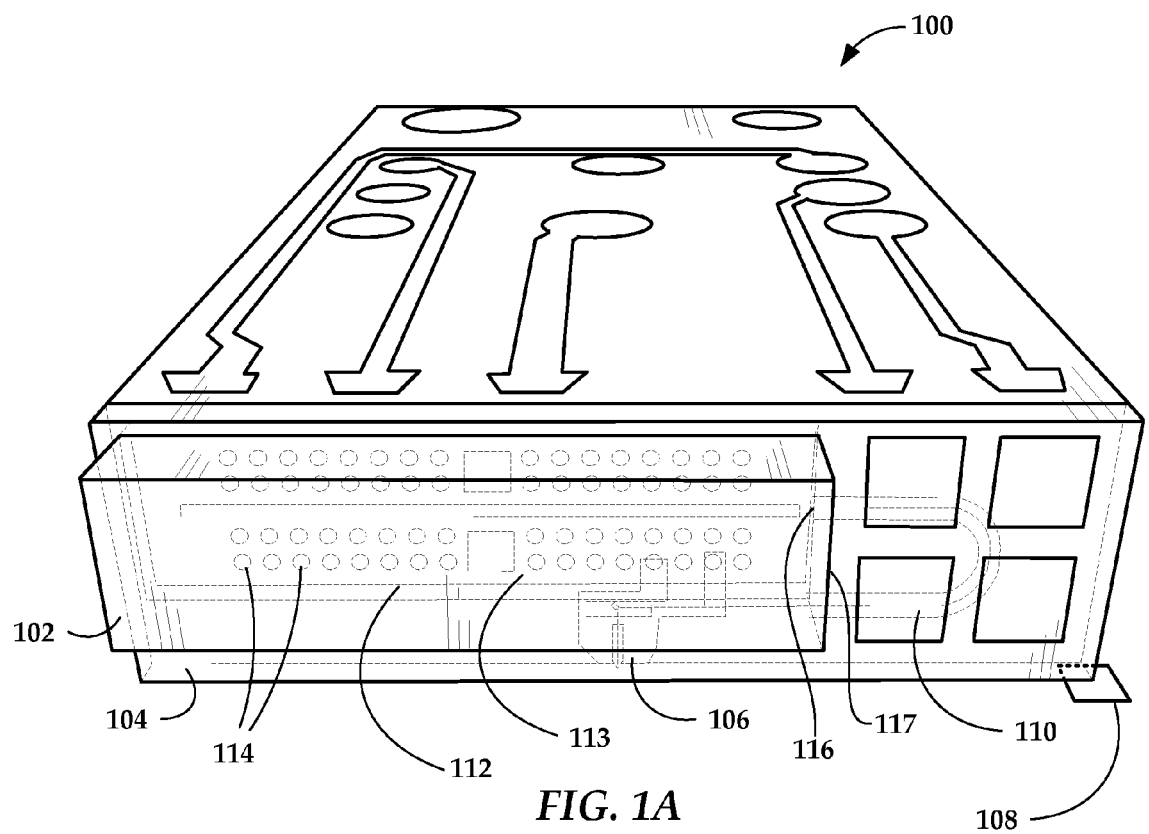
FIGS. 1A-1C are perspective views of a hard drive slider assemblies according to example embodiments.

The present disclosure relates to optical components used in applications such as heat assisted magnetic recording (HAMR). A HAMR device uses heat to overcome superparamagnetic effects that might otherwise limit the areal data density of typical magnetic recording media (e.g., hard drive disk). Recording on this media involves heating a small portion of the media while it is being written to by a magnetic write head. The heat may be generated from a coherent light source such as a laser diode. Optical components may be integrated into a hard drive slider to direct energy from the laser diode to the media.

One way to achieve a tiny confined hot spot is to use an optical near-field transducer (NFT), such as a plasmonic optical antenna or an aperture, located near an air bearing surface of a hard drive slider. Light is launched from a light source (e.g., a laser diode) into an optical waveguide built into a slider from a core and cladding with different indices of refraction. The waveguide may include a high contrast between respective refractive indices of the core and cladding. Light propagating in the waveguide may be directed to an optical focusing element, such as a planar solid immersion mirror (PSIM), which may concentrate the energy into the optical NFT. In other configurations, the waveguide may delivery light to the NFT without using a focusing element, e.g., direct delivery.

The NFT may be an integrated optics device formed within the slider. The field of integrated optics relates to the construction of optics devices on substrates, sometimes in combination with electronic components, to produce functional systems or subsystems. For example, light may be transferred between components via integrated optics waveguides that are built up on a substrate using layer deposition techniques. These waveguides may be formed using a first material as core, surrounded by a second material that acts as cladding. Other optical components may be formed in similar fashion, including the NFT and PSIM discussed above.

In a HAMR slider, light is launched into these integrated optics components for purposes of delivering optical energy to heat the media during the recording process. One way to launch light into a slider is from free space via a grating coupler fabricated in a slider, called free space light delivery. Free space light delivery assembly may utilize a laser located external to the drive head. Another way to provide light energy for HAMR recording is to form/assemble a laser light source (e.g., a laser diode) integrally with the slider. This arrangement is referred to herein as laser-in-slider or laser-on-slider. Laser-in-slider and laser-on-slider light assemblies may be built during wafer-level or slider-level manufacturing phases.

A HAMR device may need to integrate a variety of optical devices into the slider along with magneto-electrical components such as read-write heads. In one configuration, a laser-in-slider device may be formed by assembling a separate laser diode component to the slider during slider manufacturing. This may require performing additional assembly and testing operations during slider manufacture. Precision and reliability of these assembly and testing operations may be needed to ensure acceptable yields for large scale manufacture.

An example of a laser-in-slider device 100 according to an example embodiment is shown in the perspective view of FIG. 1A. In this example, an edge-emitting laser diode 102 is integrated into a trailing edge surface 104 of the slider 100. The laser diode 102 is integrated with a HAMR read/write head 106. The read/write head 106 has one edge located at an air bearing surface 108 of the slider 100. The air bearing surface 108 is held proximate to a moving media surface (not shown) during device operation. The laser diode 102 provides electromagnetic energy to heat the media surface at a point of the media near to where the read/write head 106 is positioned.

Optical coupling components, such as a waveguide 110, are formed integrally (e.g., via layer deposition) within the slider device 100 to deliver light from the laser 102 to the media.

In this example, the laser diode 102 is recessed in a cavity 112 formed in the trailing surface 104 of the slider 100. The bottom of the cavity 112 includes a mounting surface 113 that interfaces with a lower surface (e.g., surface 202 described below) of the laser diode 102. The mounting surface 113 includes solder bumps 114 that interface with corresponding bumps/pads formed on the laser 102. These solder bumps 114 facilitate bonding the laser 102 to the slider 100, provide electrical connectivity for the laser 102, and may provide other functions. For example, the solder bumps 114 may contribute to heat sinking the laser 102, assure proper alignment of an output facet 116 at an emission edge 117 of the laser 102 with the waveguide 110, etc.

In other arrangements, a laser diode similar to laser diode 102 may be disposed on a top surface of the slider, e.g., a surface opposite the air bearing surface. The laser diode 102 may be directly bonded to pads on top of the slider, or be attached via an intermediate structure referred to as a submount. In either arrangement, an output facet of the laser diode 102 is aligned with a waveguide coupler of the slider when pads of the laser diode 102 are bonded to mating pads of the slider or submount.

In another configuration, a laser light source is formed or assembled on an external surface of the slider. This arrangement is referred to herein as laser-on-slider (LoS). Laser-on-slider assemblies may also be built during wafer-level or slider-level manufacturing phases. In reference now to FIG. 1B, a perspective view shows an example of a laser-on-slider device 120 according to an example embodiment. The slider 120 includes a laser diode 122 on top of the slider body 121 and near a trailing edge 124 of the slider body 121. The laser diode 122 provides electromagnetic energy to heat the media surface at a point near to a HAMR read/write head 126, the read/write head 126 being located at a media-facing surface 128. The media-facing surface 128 is held proximate to a moving media surface (not shown) during device operation.

Optical coupling components, such as a waveguide 130, are formed integrally within the slider body 121 to deliver light from the laser 122 to the media. For example, a waveguide 130 and near-field transducer (NFT) 132 may be located proximate the read/write head 126 to provide local heating of the media during write operations. The laser diode 122 in this example may be an edge emitting device, the light being reflected into the waveguide 130 by a mirror or similar device.

Figure 1B:
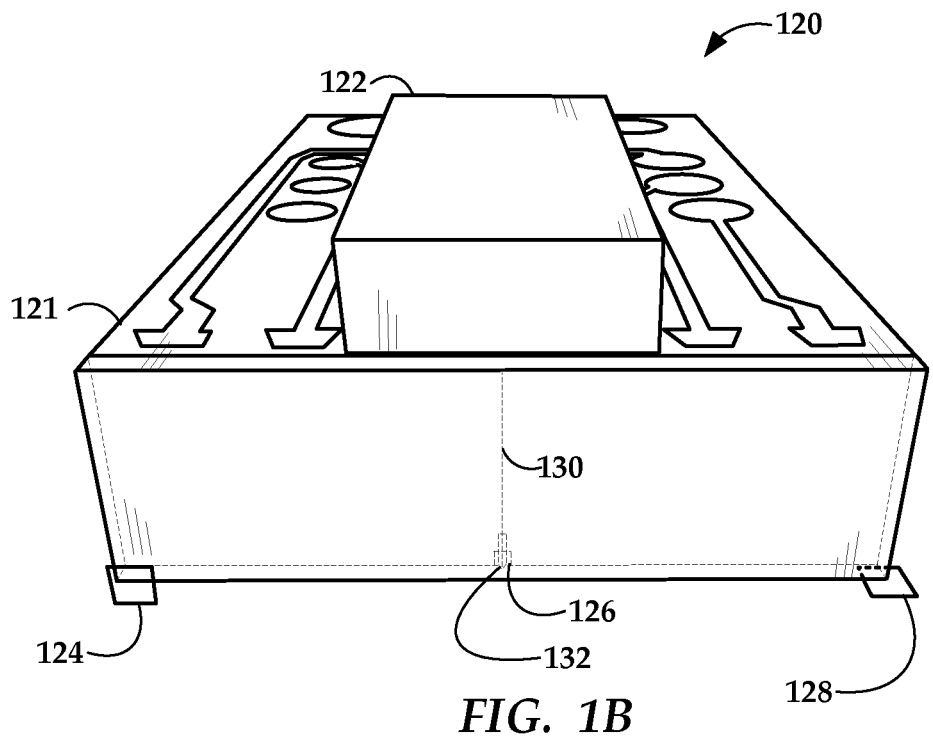
Figure 1C:
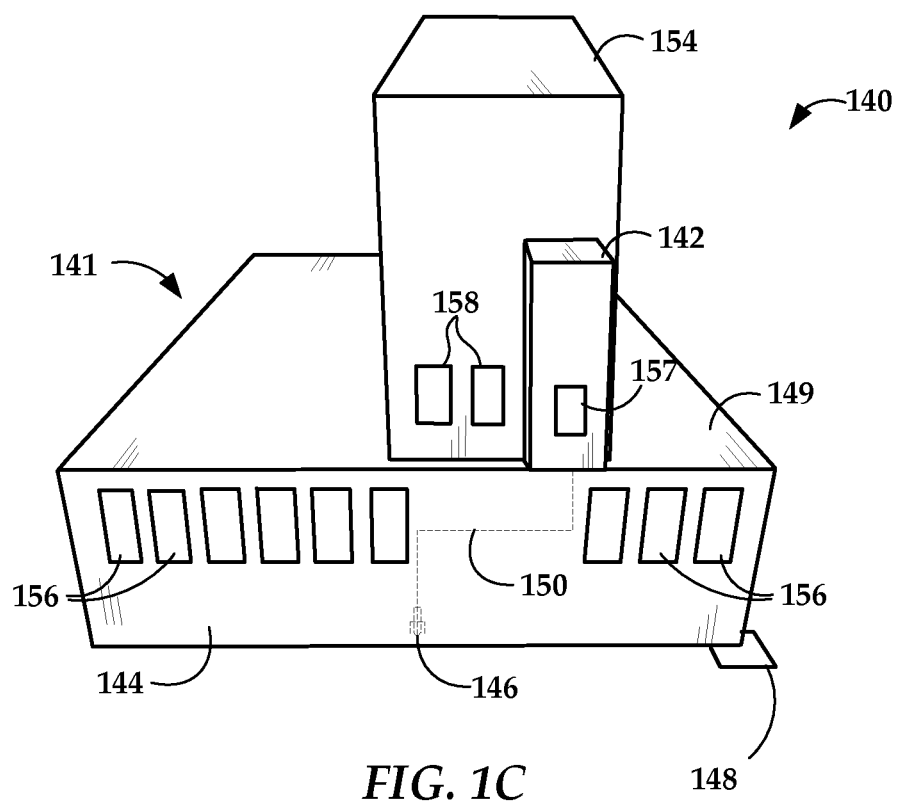

In FIG. 1C, a perspective view shows another example of a laser-on-slider device 140 according to an example embodiment. The slider assembly 140 includes a slider body 141 having a media-facing surface 148 and a top surface 149. The media-facing surface 148 is held proximate to a moving media surface (not shown) during device operation. A read/write head region 146 is located at the media-facing surface 148 near a trailing edge 144 of the slider body 141. The read/write head region 146 includes respective one or more read transducers and write transducers, as well as an optical component (e.g., a near-field transducer) that directs a small beam of energy onto the media surface. The energy is provided by a laser (e.g., laser diode) 142 coupled to a submount 154, both of which are coupled to the top surface 149 of the slider body 141.

The laser diode 142 directs light to an optical interface (e.g., waveguide input coupler, not shown) of the slider body 141, where it is coupled to a waveguide 150 that directs light to the read/write head region 146. The laser diode 142 in this example is an edge firing laser diode, and may be coupled to the waveguide 150 via a facet, grating, lens or other coupling structure known in the art. Generally, the slider body 141 is an integrated optics device that is formed together with the waveguide 150 and read/write head region 146.

The laser diode 142 and submount 154 may also be formed using integrated optics or integrated circuit manufacturing processes. However, in this example, the laser diode 142 and submount 154 are not formed together with the slider body 141, e.g., using the same layer deposition processes. The laser 142 and submount 154 are formed separately and later attached together with the slider body 141 to form the slider assembly 140. The submount 154 provides mechanical and electrical connections between the laser diode 142, and slider body 141. The slider body 141, laser diode 142 and submount 154 have electrical connecting pads 156-158 that provide electrical connectivity between the HAMR slider 140 and a trace-gimbal assembly (not shown).

Figure 2A:
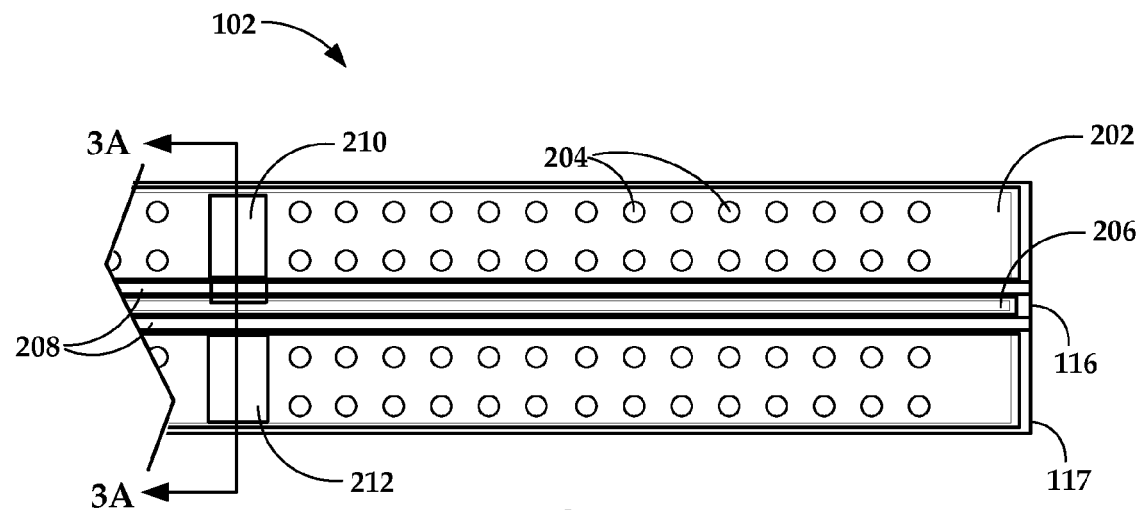
FIGS. 2A and 2B are respective bottom and perspective views of a laser diode according to an example embodiment.
Figure 2B:
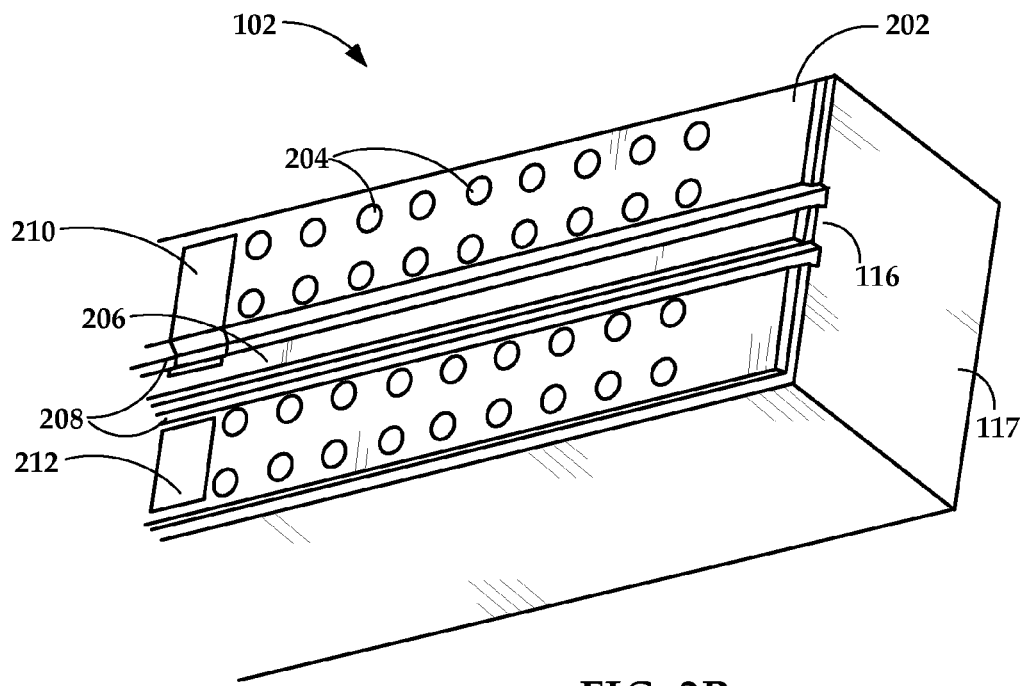

A more detailed view of alignment features of the edge-emitting laser diode 102 are shown in FIGS. 2A, 2B. In particular, FIGS. 2A and 2B are respective bottom and perspective views showing electrical and optical interface features of a laser diode 102 such as is shown in FIG. 1. As previously described, the laser 102 includes an output facet 116 on emission end 117 that launches light into a waveguide (e.g., waveguide 110 in FIG. 1) for delivery to a HAMR media. The junction surface 202 of the laser 102 includes a plurality of solder pads 204 configured to interface with the solder bumps (e.g., bumps 114 in FIG. 1) on the slider device 100. A conductive surface (e.g., stripe) 206 is surrounded on either side by elongated channels 208. The conductive surface 206 may facilitate electrically coupling an anode (or cathode) side of the laser 102 to a slider assembly during a bonding/reflow phase. The conductive surface 206 may also act as a heat sink when bonded to a slider assembly.

Also seen in FIGS. 2A and 2B are test pads 210, 212. These test pads 210, 212 are also located on lower surface 202 alongside the solder pads 204 and stripe 206, and may be respectively coupled to anode and cathode layers within the laser diode 102. Generally, the test pads 210, 212 facilitate automated testing of the laser 102 without risk of damaging the solder pads 204 and/or stripe 206.

Testing a semiconductor laser such as laser diode 102 may require an electrical connection from a test circuit to the laser's anode and cathode terminals. In typical semiconductor laser designs, the junction side is metalized to provide one terminal (e.g., the anode terminal), and the substrate side of the laser is metalized to provide the other terminal (e.g., the cathode terminal). These junctions are configured in such as way as to form an electrical coupling with the slider upon installation. In the illustrated example, the cathode and anode junctions are configured as solder pads 204 and center stripe 206, respectively.

In order to test such a configuration, test probes may be brought into contact with junctions 204, 206 in order to electrically couple the laser 102 to a test circuit. For some semiconductor laser designs, however, use of the coupling features 204, 206 for testing may be undesirable. For example, the design of junctions 204, 206 illustrated in FIGS. 2A-B and 3 may be designed (along with associated interfacing features of the slider) to physically align the laser 102 with the slider during reflow operation, e.g., in response to surface tension forces exerted by the reflowed solder that bonds the laser 102 to the slider. Thus the solder pads 204 and stripe 206 may perform both electrical and physical coupling of the laser 102, and proper alignment during this coupling may further depend on the solder pads 204 and stripe 206 being undamaged (e.g., dimpled, scratched) due to testing and/or handling of the laser 102.

In the illustrated semiconductor laser design and equivalents thereof, any contact to the slider-coupling connections (e.g., solder pads 204 and stripe 206) may damage the laser 102 and/or cause alignment problems during laser-to-slider assembly. Instead of using these junctions 204, 206 for testing, test probes can electrically test the laser 102 by contacting the test pads 210, 212. This facilitates electrical testing without requiring direct physical contact by test probes with the laser stripe 206 and solder pads. The test pads 210, 212 may only be intended for use as probe locations during testing, and need not be physically bonded to the slider assembly 100, e.g., via solder.

As shown, the test pads 210, 212 are disposed on the junction surface 202 of the semiconductor laser along with the coupling connections 204, 206. This co-location with the coupling connections 204, 206 on surface 202 may make the laser 102 easier to manufacture. The location of test pads 210, 212 on surface 202 may also render the test pads 210, 212 inaccessible after assembly of the laser to the slider, e.g., lower surface 202 faces corresponding surface 113 after laser placement. However, assuming solder reflow that bonds the laser 102 to the slider 100 is successful, there may be other contact points on the slider assembly 100 that facilitate testing the laser 102, such that access to the test pads 210, 212 is no longer needed.

Figure 3A:
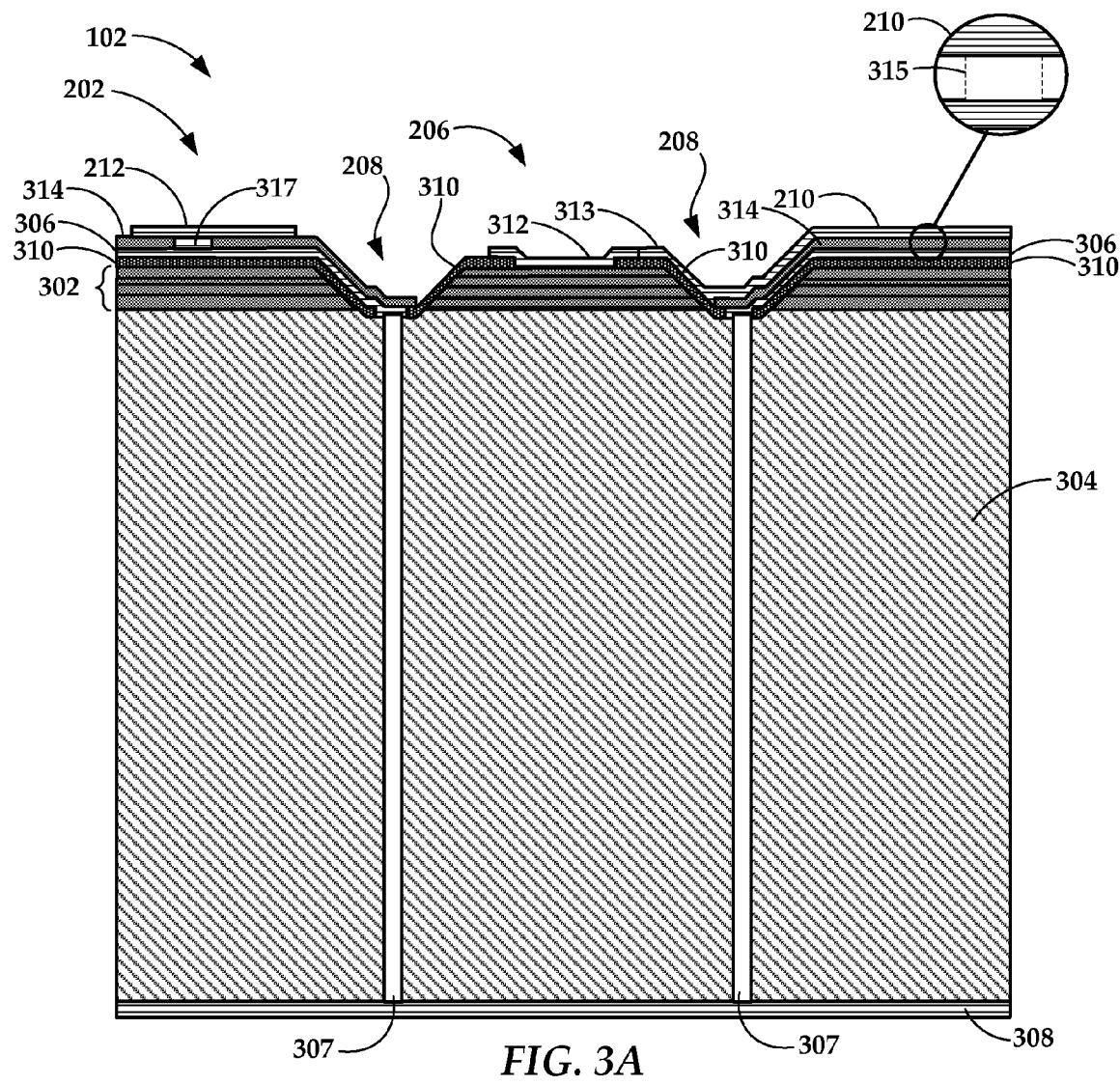
FIGS. 3A and 3B are a cross-sectional views of a laser diode according to example embodiments.

In reference now to FIG. 3A, a cross sectional view of a semiconductor laser 102 corresponding to section 3A-3A shown in FIG. 2A illustrates additional details according to an example embodiment. As seen in this view, junction layer/layers 302 are overlaid on top of a substrate 304. The junction layers 302 form the quantum well of the laser 102. Top and bottom cathode metal layers 306, 308 are in electrical contact with the substrate 304. The top cathode layer 306 may be used to form the solder pads 204, and may be electrically coupled to the bottom cathode layer 308 thru the electrically conductive substrate 304 and/or through optional vias 307. The cathode metal layer 306 is kept isolated from the junction layers 302 by way of insulating layer 310. An isolation layer 314 covers the cathode layer 306, and may include vias (e.g., vias 315) through which solder pads (e.g., solder pads 204 seen in FIGS. 2A-2B) are formed. On the left hand side, via 317 couples test pad 212 to the cathode layer.

On the right-hand side of FIG. 3A, the isolation layer 314 is shown covered by a connection strip 313 that couples an anode metal layer 312 with one of the aforementioned test pads 210. The anode metal layer 312 extends along the center of the laser 102, and is in electrical contact with the semiconductor layers/quantum well 302. The anode layer 312 may be part of the stripe 206 seen in FIGS. 2A-2B. There may be a corresponding test pad (not shown) on the left-hand side of FIG. 3A, e.g., formed by exposure of layer 306 through isolation layer 314, and/or an additional layer on top of the isolation layer 314 that is coupled to layer 306, e.g., using vias.

The top most anode 312 and cathode 306 layers are both generally disposed near the top surface in FIG. 3A, which may generally correspond to surface 202 seen in FIGS. 2A and 2B. Because these layers 306, 312 are already proximate the top surface, the test pads 210, 212 may be formed on or near the same surface 202. For example, vias (e.g., similar to via 315) or the like through layer 314 may be used to couple a test pad to layer 306 on the left-hand side of the figure. The test pads may be formed so that they are co-planar or recessed compared to other bonding/alignment features such as solder pads or stripe 206. Placing the test pads at this relative height may ensure that the test pads do not later interfere with laser alignment.

For example, in reference again to FIG. 2B, the stripe 206 may protrude higher relative to a plane of surface 202 than solder pads 204. These height differences may be accounted for during assembly, e.g., by forming corresponding features on the slider 100 and/or by forming appropriately sized solder bumps/features on the slider 100 to account for height difference. In such a case, the test pads 210, 212 may be disposed substantially co-planar with the solder pads 204. In the inverse configuration (e.g., solder pads 204 protrude higher relative to surface plane than stripe 206), the test pads 210, 212 may be disposed substantially co-planar with the stripe 206. Where both solder pads 204 and stripe 206 are substantially co-planar, the test pads 210, 212 may also be co-planar with the solder pads 204 and stripe 206, or be at a lower level relative to a plane of surface 202 than either solder pads 204 or stripe 206.

It will be appreciated that the above description of 202 as a "surface" does not necessarily require that the surface 202 be planar. While the surface 202 may have a common plane for locating some (or even a majority of) features, some features may be non-co-planar with other features and still be considered as part of the surface 202. Generally, the surface 202 is at least intended to represent a three-dimensional mechanical interface of the laser 102 for coupling to slider 100 or other optical/electrical assembly. For example, processes such as etching, chemical-mechanical polishing/planarization, etc., may be used to alter heights of some features of the surface 202 relative to others. Thus, the description of an element being disposed on surface 202 is not intended to require that such element be co-planar with other elements also disposed on the surface 202.

Figure 3B:
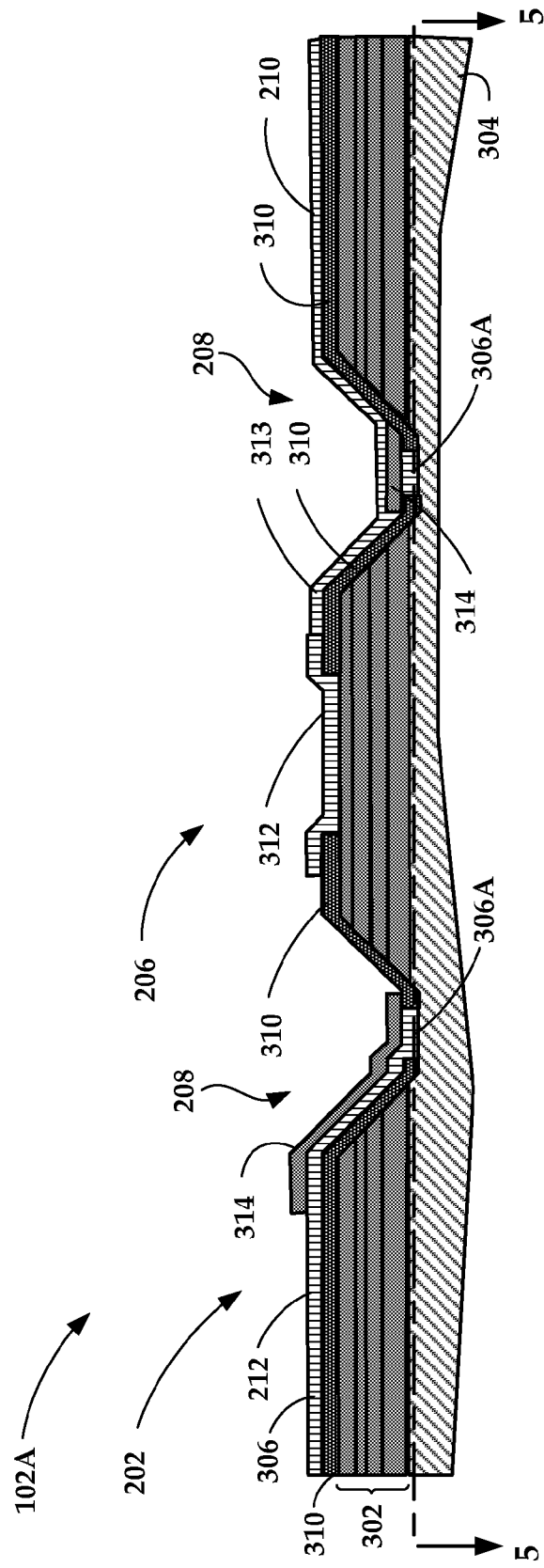

In FIG. 3B, a cutaway diagram illustrates an alternate arrangement of test pad layers of a laser diode 102A. In this example, test pads 210, 212 may be recessed relative to other features of surface 202. The cross section of FIG. 3B is taken where the test pads 210, 212 are located. At locations other than that shown in FIG. 3B, the anode and cathode layer 312, 306 in this configuration may be substantially similar to that shown in FIG. 3A (although without the connection strip 313 and test pad 210 at those locations). At this location, isolation layer 314 may be truncated/shortened on the left-hand side to expose part of cathode layer 306, and thereby form test pad 212. On the right-hand side (at the bottom of the channel), both the cathode layer 306 and isolation layer 314 are truncated/shortened. The connection strip 313 and test pad 210 are overlaid on top of the respective isolation layer 314 and insulating layer 310. In this way, the test pads 210, 212 may be situated lower relative to surface 202 than either the cathode layer 306 or isolating layer 314, which may correspond to the surface level of the stripe 206 and pads 204, respectively, as seen in FIG. 2.

As can be seen in FIG. 3B, cathode layer 306 couples directly to the substrate 304 at trench regions 306A, and no vias (e.g., similar to vias 307 in FIG. 3A) are used. The top cathode layer 306 and anode layer 312 allows both anode and cathode electrical connections to be made from the junction surface 202. In such a case, a bottom cathode layer such as layer 308 shown in FIG. 3A may be not be needed. In some cases, if the same laser diode is desired for use in both a laser-in-slider configuration as shown in FIG. 1A and a laser-on-slider configuration as shown in FIG. 1B or 1C. One or both of top and bottom cathode layers 306, 308 may be included and used for coupling the substrate 304 to cathode electrical connections of an apparatus.

Figure 4:
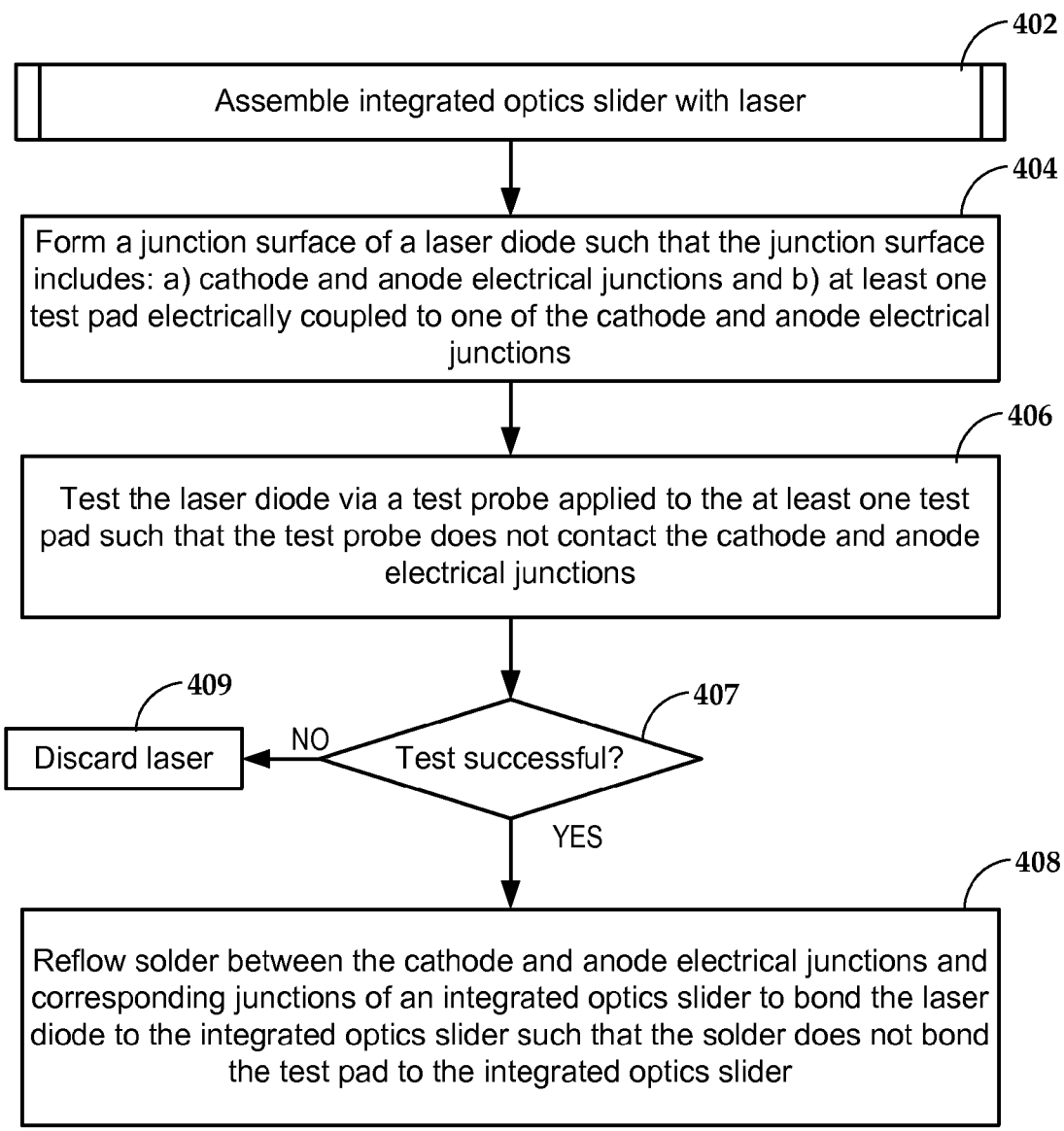
FIG. 4 is a flowchart illustrating a procedure according to an example embodiment.

In reference now to FIG. 4, a flowchart illustrates a procedure 402 for assembling an integrated optics slider according to an example embodiment. The procedure 402 involves forming 404 a junction surface of a laser diode. The junction surface includes: a) cathode and anode electrical junctions; and b) at least one test pad electrically coupled to one of the cathode and anode electrical junctions. The laser diode is tested 406 via a test probe applied to the at least one test pad. During the test 406, the test probe does not contact the cathode and anode electrical junctions.

The testing 406 may involve any electrical or optical test known in the art. For example, the testing the laser diode may involve testing one or more of laser light output power with drive current, output beam divergence, lasing spectrum, voltage across the laser diode for a given drive current, and aging characteristics for screening out early life failures prior to assembly. The testing may be performed in batches on assemblies (e.g., wafers, bars) and/or may be performed on individual laser diodes. If it is determined 407 that the test is not successful, the laser may be disposed of 409 (e.g., marked as failed if part of a batch test so that it is not further used during assembly).

If the test is successful, the method further involves reflowing 408 solder between the cathode and anode electrical junctions and corresponding junctions of an integrated optics slider to bond the laser diode to the integrated optics slider. This can occur after placement of the laser diode into the slider, e.g., setting of laser into cavity of the slider that facilitates alignment therebetween. This placement may cause the test pad (which may be located on a lower surface of the slider) to be disposed between the junction surface and a corresponding surface of the integrated optics slider. During the reflow 408, the solder does not bond the test pad to the integrated optics slider. Thus, if the test pad is damaged due to the testing for example, the damaged test pad does not affect alignment of the laser diode with the integrated optics slider.

In reference again to FIG. 3B, the laser diode 102A includes trench regions 306A of the top cathode layer 306 that couple the substrate 304 to the junction surface 202. The trench regions 306A eliminate the need to use wire bonds (e.g., gold wire) running outside of the diode from the substrate 304 to the junction surface 202. Wire bonds can increase manufacturing cost, and may require additional pads on or extending out from the surface 202 on which to couple the wires, if the wire bonds are used within a laser package. Due to the small size desired for the laser diode 102A, there may be insufficient space to include additional pads either on the mating surface or extending out from the laser. Additionally, wire bonds may also impact laser performance due to high inductance of the wire used in the bonding.

The aforementioned top cathode layer 306 can eliminate the need for wire bonds to electrically couple the laser diode 102 to a slider or other component. The top cathode layer 306 allows for lower inductance traces to be fabricated at the junction surface 202, and allow for a smaller junction surface 202. The top cathode layer 306 also facilitate attaching the laser 102 to a slider (or other component) via relatively inexpensive flip-chip bonding due to the anode and cathode connections being on the same surface 202 of the laser 102. A bottom cathode layer (e.g., bottom cathode layer 308 in FIG. 3A) may optionally be included to provide an alternate connection point, e.g., for a laser-on-slider configuration, heatsinking, etc.

Figure 5:
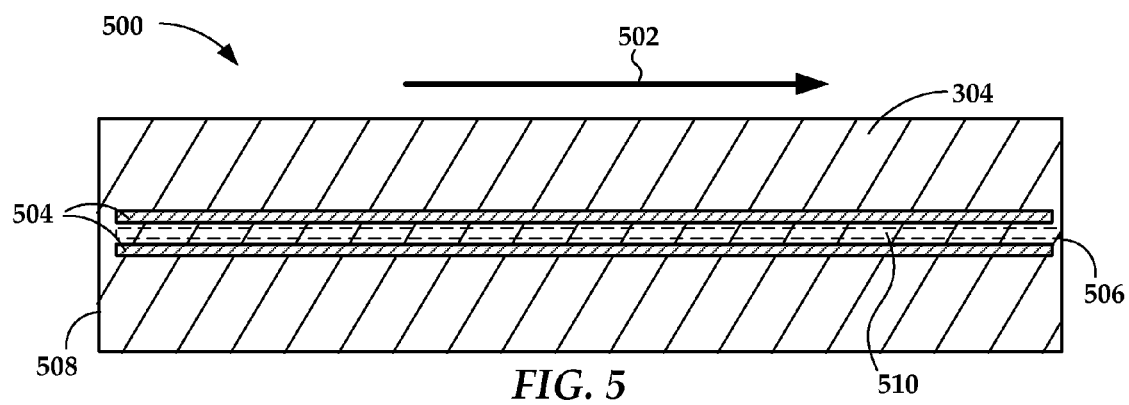
FIGS. 5-7 are cross sectional views of laser diodes illustrating configurations of cathode vias according to various example embodiments.
Figure 6:
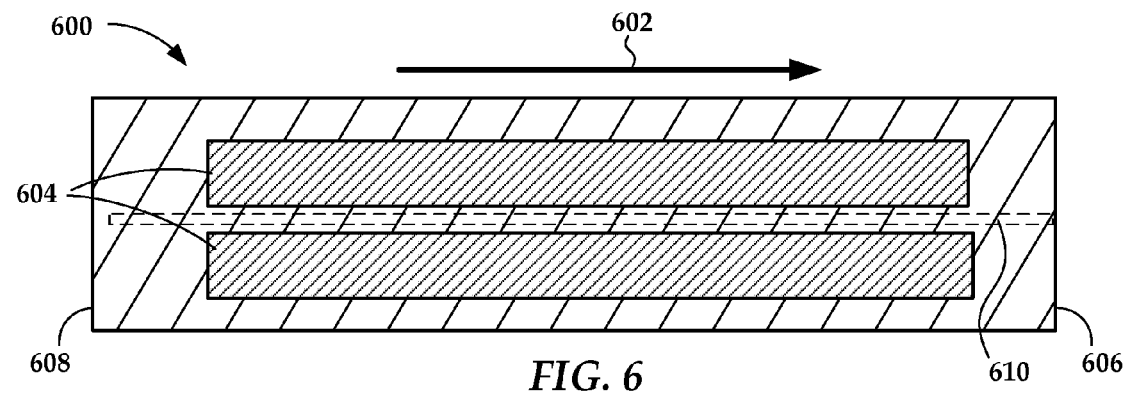

In reference now to FIGS. 5 and 6, cross-sectional views illustrate configurations of cathode trench regions according to various embodiments. The illustrations in FIGS. 5 and 6 generally correspond to cross sections near a trench region of the cathode layer, such as indicated by section line 5-5 in FIG. 3B. In FIGS. 5 and 6, arrows 502, 602 define laser output directions, e.g., directions at which light is emitted from the lasers. In FIG. 5, laser diode 500 includes elongated trench regions 504 extending substantially from light emission edge 506 to an opposing edge 508. For purposes of this example, "substantially" may include a continuous via portion that extends anywhere from half to all of the distance between light emitting edge 506 and opposing edge 508. The trench regions 504 are disposed at the bottom of channels (e.g., channels 208 in FIG. 2) that surround a laser stripe region 510, which is analogous to laser stripe region 206 of laser 102 shown in FIG. 2.

An alternate via arrangement is shown for laser diode 600 in FIG. 6. This laser diode 600 includes a plurality of wider trench regions 604 that are arrayed lengthwise between light emission edge 606 and opposing edge 608. The trench regions 604 are disposed on either side of a laser stripe region 610. The trench regions 604 are of substantially similar size and shape, although either size or shape of individual trench regions 604 may vary.

Figure 7:
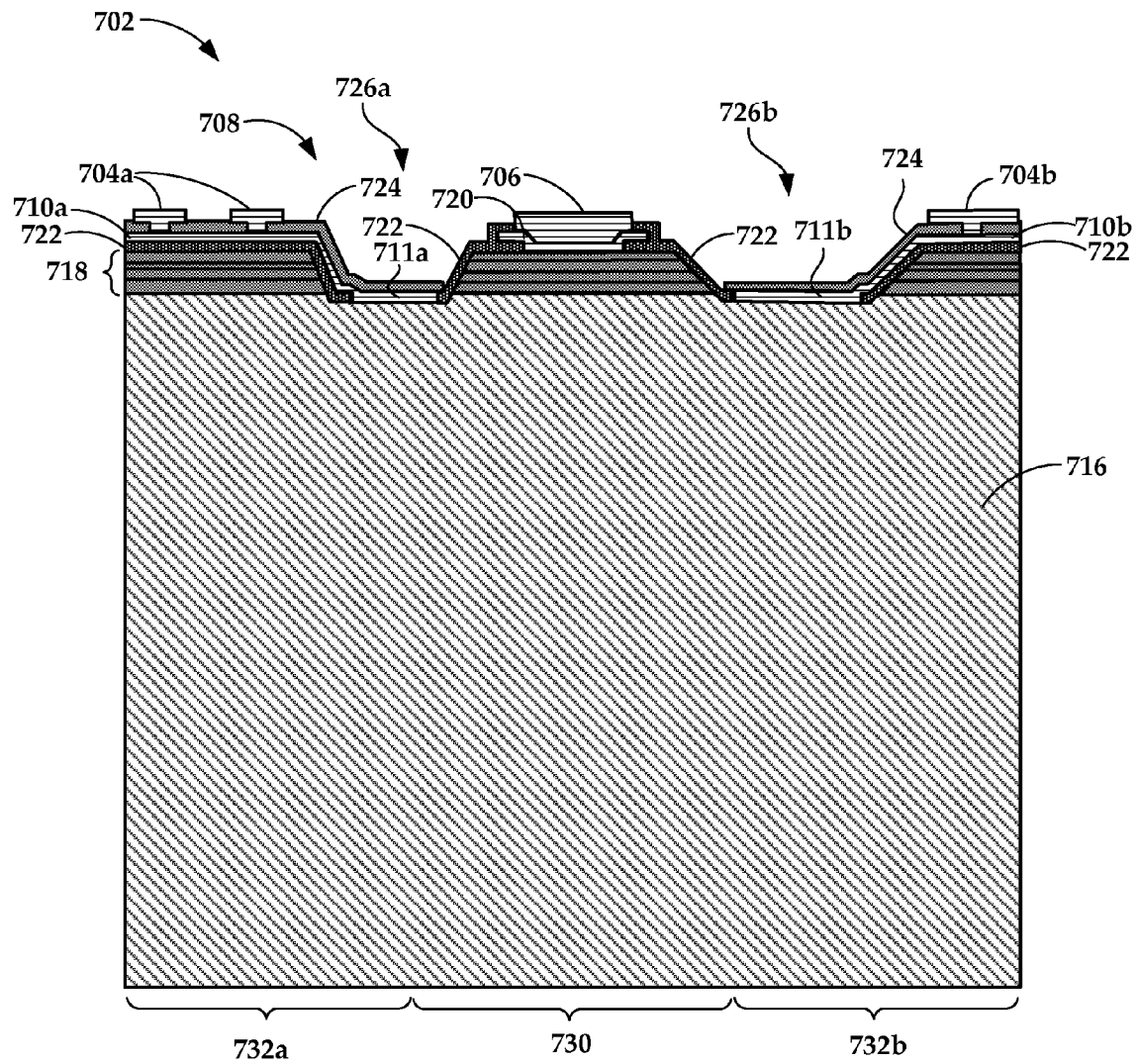

In reference now to FIG. 7, a cross sectional view of a semiconductor laser diode 702 illustrates alternate trench regions configurations according to additional example embodiments. In this view, the laser diode 702 has two alternate configurations of channels 726a, 726b that increase surface area at the trench regions 711a, 711b. Cathode electrical junctions 704a, 704b and anode electrical junction 706 are disposed on a junction surface 708 of the laser diode 702. The cathode electrical junctions 704a, 704b may be configured as a plurality of conductive pads (e.g., circular or elongated solder bumps) coupled to top cathode metal layers 710a, 710b. Trench regions 711a, 711b electrically couple top cathode metal layers 710a, 710b to the substrate 716.

Junction layers 718 are overlaid on top of the substrate 716. The junction layers 718 form the quantum well of the laser diode 702. The anode electrical junction 706 is coupled to the top of the junction layers 718 through an anode metal layer 720. While these and other layers (e.g., cathode metal layer) are described as "metal" layers for purposes of convenience, those of ordinary skill in the art will understood that non-metallic materials may be used to form all or part of the layers, e.g., such that that the layer still provides the electrical coupling as described.

As shown previously (e.g., in FIG. 2B), the anode electrical junction 706 may be formed as an elongated strip running along the length of the laser diode 702 (e.g., along the laser output direction). In other arrangements, the anode electrical junction 706 may include two or more pads similar to the cathode electrical junctions 704. The pads may be coupled to the anode metal layer 720 along the length of the laser diode 702. The anode electrical junction 706 is disposed along anode region 730, which generally defines the lasing stripe. Cathode regions 732a, 732b are below the cathode metal layers 710a, 710b. Generally, t the regions 730, 732a, 732b are partitioned where the channels 726a, 726b cut through the junction layers 718.

The cathode metal layers 710a, 710b are kept isolated from the junction layers 718 by way of one or more insulating layers 722. An isolation layer 724 covers the cathode metal layers 710a, 710b except where the cathode pads 704a, 704b protrude to contact the cathode metal layers 710a, 710b. The isolation layer 724 extends to the anode electrical junction 706 and may also electrically isolate parts of the anode metal layer 720. The cathode metal layer 710 is joined with the trench regions 711a, 711b at the bottom of the channels 726a, 726b that extends through the junction layers 718 to the substrate 716. The channels 726a, 726b are disposed on either side of the anode electrical junction 706 along the laser output direction (e.g., similar to channels 208 in FIG. 2B).

Channels 726a, 726b include example geometric features that facilitate enlarging the trench portions 711a, 711b to improve performance of the laser diode 702. Channel 726a may have a substantially similar width at the top of the channel as previous examples (e.g., see FIG. 3B) but has steeper sidewall angles. It may be more challenging to metallize the sidewalls of channel 726a due to the steep angle. However, the steep angle enlarges the trench portion 711a while leaving enough room on the junction surface 708 for two rows of cathode pads 704a.

Channel 726b includes similar sidewall angles as previous examples (e.g., see FIG. 3B) and has a wider channel width. This facilitates easier manufacture of the cathode layer 710b but may leave less room for the cathode pad 704b. In this example the cathode pad is enlarged compared to pads 704a to compensate and ensure that the pads 707a have, e.g., sufficiently low resistance, desired heat transfer properties, etc. It will be understood that a particular laser diode may two of either channel configuration 726a, 726b symmetrically or asymmetrically disposed around the anode region 730. In other arrangements, a laser diode may include only one channel 726a, 726b, which forms a single cathode region 732a, 732b arranged side-by-side with an anode region 730.

The laser diode 702 may also include a bottom cathode layer (not shown) disposed on a surface of the substrate 716 opposite the junction surface 708. See, for example, bottom cathode layer 308 in FIG. 3A. The bottom cathode layer provides an alternate electrical coupling to the substrate 716. This may facilitate alternate mounting configurations, e.g., laser-in-slider as shown in FIG. 1A and laser-on-slider as shown in FIGS. 1B and 1C.

Figure 8:
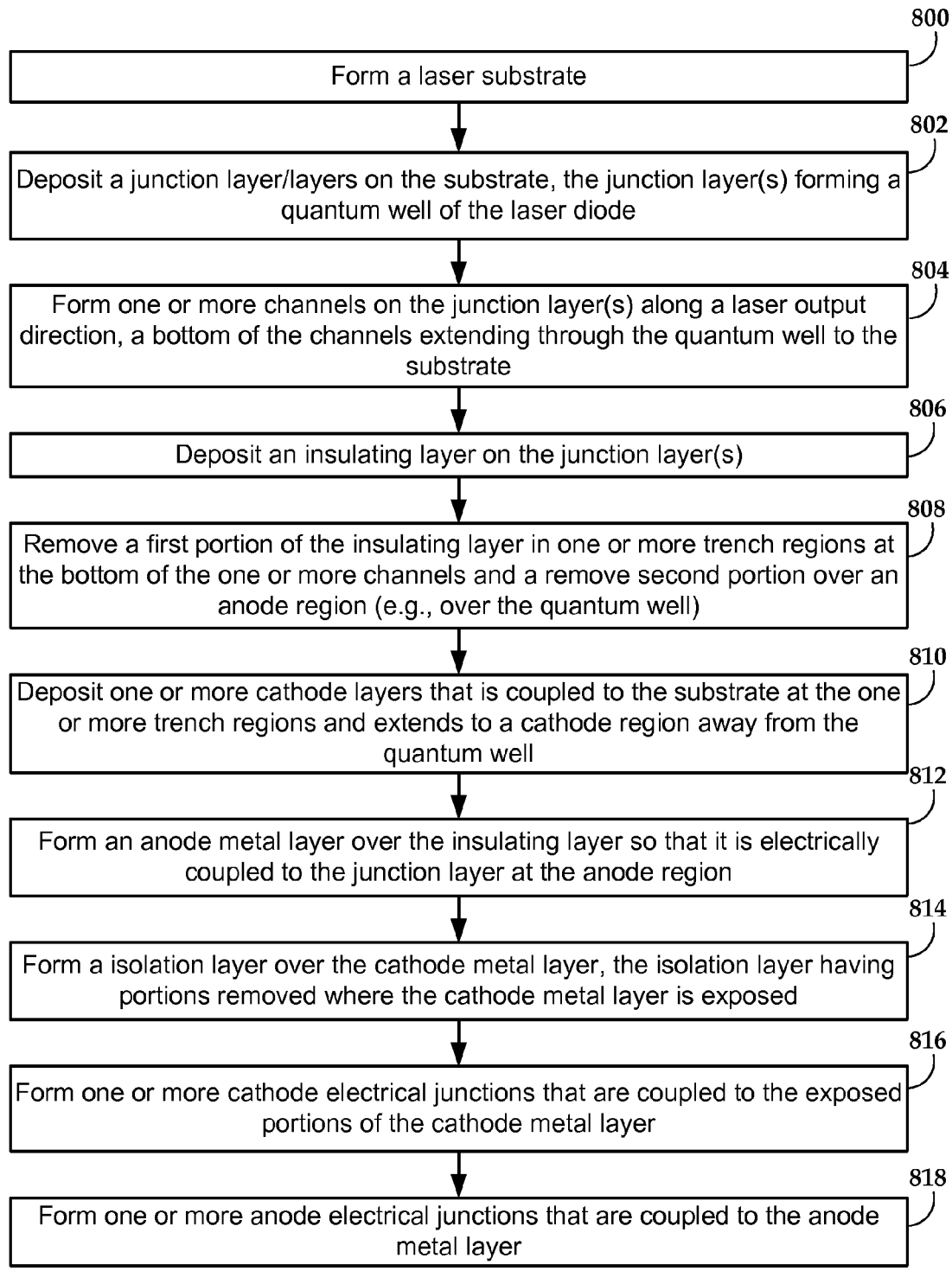
FIG. 8 is a flowchart illustrating a procedure according to another example embodiment.

In reference now to FIG. 8, a flowchart illustrates a method used for forming a laser diode according to an example embodiment, e.g., as shown in FIG. 3B and/or FIG. 8. The method involves forming 800 a laser substrate. A unction layer is deposited 802 on the substrate. The junction layer forms a quantum well of the laser diode, e.g., down the center of the laser diode along a laser output direction. One or more channels are formed 806 in the junction layer along the laser output direction. Bottoms of the one or more channels extend through the junction layer to the substrate.

The method further involves depositing 806 an insulating layer on the junction layers, and removing 808 a portion of the insulating layer in the one or more trench regions at the bottom of the one or more channels. A cathode metal layer is formed 810 over the insulating layer. The cathode metal layer extends from the one or more trench regions (where it is coupled to the substrate) to a cathode region away from the quantum well. An anode metal layer is formed 812 over the insulating layer and electrically coupled to an anode portion of the junction layers, e.g., between two channels if two or more channels are used. An isolation layer is formed 814 over the cathode metal layer. The isolation layer includes regions where portions of the cathode metal layer are exposed. One or more cathode electrical junctions are formed 816 so that the junctions are coupled to the exposed portions of the cathode metal layer. One or more anode electrical junctions are formed 818 so that the junctions are coupled to the anode metal layer.

It will be understood that the method illustrated in FIG. 8 is for purposes of example, and many variations are possible in light of the above teachings. For example, operations may be performed a different order than what is shown. Additionally, some operations may be optional depending on the final configuration of the laser diode. For example, the isolation layer may be optional, or have a different configuration. In another variation, more or fewer channels and/or vias may be used.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the disclosure not be limited with this detailed description, but rather determined by the claims appended hereto.

What is claimed is:

1. A method comprising:
   forming a laser substrate;
   depositing a junction layer on the laser substrate, the junction layer forming a quantum well of a laser diode;
   forming one or more channels through the junction layer along a laser output direction, a bottom of the one or more channels extending to the laser substrate;
   depositing an insulating layer on the junction layer;
   removing a portion of the insulating layer in one or more trench regions at the bottom of the one or more channels;
   forming a cathode metal layer over the insulating layer, the cathode metal layer coupled to the laser substrate at the one or more trench regions; and
   forming one or more cathode electrical junctions coupled to the cathode metal layer, the one or more cathode electrical junctions exposed at a junction surface of the laser diode.

2. The method of claim 1, further comprising, forming an isolation layer over the cathode metal layer, the isolation layer including regions where portions of the cathode metal layer are exposed, the cathode electrical junctions being formed over the regions.

3. The method of claim 1, further comprising:
   removing a second portion of the insulating layer at an anode region to expose the junction layer; and
   forming an anode metal layer on the junction layer at the anode region; and
   forming one or more anode electrical junctions that are coupled to the anode metal layer.

4. The method of claim 3, wherein the one or more anode electrical junctions comprise an elongated strip running along a length of the laser diode.

5. The method of claim 1, wherein the trench region is elongated along a laser output direction of the laser diode.

6. The method of claim 5, wherein the trench region extends substantially from an emission edge to an opposing edge of the laser diode.

7. The method of claim 1, wherein the one or more channels are elongated along the laser output direction of the laser diode.

8. The method of claim 1, wherein the one or more channels comprises two channels, and the method further comprising forming an anode region between the two channels.

9. The method of claim 8, wherein forming the cathode metal layer comprises forming two cathode regions on either side of the anode region.

10. The method of claim 9, wherein forming the one or more cathode electrical junctions comprises forming first and second pluralities of solder bumps on the two cathode regions.

11. The method of claim 1, wherein the one or more cathode electrical junctions comprise a plurality of solder bumps.

12. The method of claim 1, further comprising forming a bottom cathode layer on a surface of the substrate opposite the junction surface, the bottom cathode layer providing an alternate electrical coupling to the laser substrate.

13. The method of claim 1, further comprising electrically coupling the cathode electrical junction and the anode electrical junction to a mounting surface of a magnetic hard drive slider.

14. The method of claim 13, wherein the mounting surface of the magnetic hard drive slider comprises a top surface of the slider that faces away from a media-facing surface of the slider.

* * * * *